United States Patent
Ozyilmaz (10) Patent No.: US 9,715,247 B2
(45) Date of Patent: Jul. 25, 2017

(54) TOUCH SCREEN DEVICES EMPLOYING GRAPHENE NETWORKS WITH POLYVINYLIDENE FLUORIDE FILMS

(71) Applicant: National University of Singapore, Singapore (SG)

(72) Inventor: Barbaros Ozyilmaz, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/430,425

(22) PCT Filed: Oct. 3, 2013

(86) PCT No.: PCT/SG2013/000429
§ 371 (c)(1),
(2) Date: Mar. 23, 2015

(87) PCT Pub. No.: WO2014/055040
PCT Pub. Date: Apr. 10, 2014

(65) Prior Publication Data
US 2015/0241908 A1      Aug. 27, 2015

Related U.S. Application Data

(60) Provisional application No. 61/709,220, filed on Oct. 3, 2012.

(51) Int. Cl.
| | | |
|---|---|---|
| G06F 1/16 | (2006.01) | |
| G06F 3/044 | (2006.01) | |
| G06F 3/045 | (2006.01) | |
| H01L 41/193 | (2006.01) | |
| H01L 41/257 | (2013.01) | |
| B32B 27/08 | (2006.01) | |
| B32B 27/30 | (2006.01) | |
| B32B 27/32 | (2006.01) | |

(Continued)

(52) U.S. Cl.
CPC ............... G06F 1/16 (2013.01); B32B 27/08 (2013.01); B32B 27/304 (2013.01);
(Continued)

(58) Field of Classification Search
CPC . G06F 1/16; G06F 3/045; G06F 3/044; G06F 2203/04103; G06F 2203/04107;
(Continued)

(56) References Cited

U.S. PATENT DOCUMENTS

| | | | | |
|---|---|---|---|---|
| 9,098,162 B2* | 8/2015 | Ahn | ....................... | G06F 3/045 |
| 2004/0002176 A1* | 1/2004 | Xu | ......................... | B82Y 10/00 |
| | | | | 438/40 |

(Continued)

FOREIGN PATENT DOCUMENTS

| | | |
|---|---|---|
| WO | WO 2011/096700 A2 | 8/2011 |
| WO | WO 2012/064285 A1 | 5/2012 |

OTHER PUBLICATIONS

International Search Report and Written Opinion of International Application No. PCT/SG2013/000429; Date Mailed: Dec. 4, 2013, Entitled: "Touch Screen Devices Employing Graphene Networks with Polyvinylidene Fluoride Films".

(Continued)

*Primary Examiner* — Stephen Sherman
(74) *Attorney, Agent, or Firm* — Hamilton, Brook, Smith & Reynolds, P.C.

(57) ABSTRACT

The invention relates to layered graphene-ferroelectric structures for use as transparent electrodes in touch panels and display screen applications.

17 Claims, 4 Drawing Sheets

(51) Int. Cl.
  *C23C 16/04* (2006.01)
  *C23C 16/26* (2006.01)
  *C23C 16/46* (2006.01)
  *B82Y 15/00* (2011.01)
  *B82Y 40/00* (2011.01)

(52) U.S. Cl.
  CPC ......... *B32B 27/322* (2013.01); *C23C 16/042* (2013.01); *C23C 16/26* (2013.01); *C23C 16/46* (2013.01); *G06F 3/044* (2013.01); *G06F 3/045* (2013.01); *H01L 41/193* (2013.01); *H01L 41/257* (2013.01); *B32B 2307/20* (2013.01); *B32B 2307/412* (2013.01); *B32B 2307/42* (2013.01); *B32B 2457/208* (2013.01); *B82Y 15/00* (2013.01); *B82Y 40/00* (2013.01); *G06F 2203/04103* (2013.01); *G06F 2203/04107* (2013.01); *G06F 2203/04112* (2013.01); *Y10S 977/843* (2013.01); *Y10S 977/956* (2013.01)

(58) Field of Classification Search
  CPC ......... G06F 2203/04112; C23C 16/042; C23C 16/26; C23C 16/46; B32B 27/322; B32B 27/304; B32B 27/08; B32B 2307/20; B32B 2307/412; B32B 2307/42; B32B 2457/208; H01L 41/193; H01L 41/257; Y10S 977/843; Y10S 977/956; B82Y 40/00; B82Y 15/00
  See application file for complete search history.

(56) References Cited

U.S. PATENT DOCUMENTS

| | | | | |
|---|---|---|---|---|
| 2004/0090426 | A1* | 5/2004 | Bourdelais | G06F 3/045 345/173 |
| 2005/0076824 | A1* | 4/2005 | Cross | G06F 3/045 116/205 |
| 2008/0211394 | A1* | 9/2008 | Koshihara | G06F 3/044 313/504 |
| 2009/0160824 | A1* | 6/2009 | Chih-Yung | G06F 3/044 345/175 |
| 2010/0309164 | A1* | 12/2010 | Yeh | G06F 3/044 345/174 |
| 2011/0033688 | A1* | 2/2011 | Veerasamy | C30B 25/02 428/220 |
| 2011/0170330 | A1 | 7/2011 | Oezyilmaz et al. | |
| 2012/0319976 | A1* | 12/2012 | Ahn | G06F 3/045 345/173 |

OTHER PUBLICATIONS

Ji, H. X., et al., "Ultrathin Graphite Foam: A Three-Dimensional Conductive Network for Battery Electrodes," *Nano Lett* 12(5):2446 (2012).

Ni, G., et al., "Graphene-Ferroelectric Hybrid Structure for Flexible Transparent Electrodes," *ACS Nano* 6(5):3935-3942 (2012).

Novoselov, K. S., et al., "Two-Dimensional Atomic Crystals," *PNAS* 102(30):10451-10453 (2005).

Novoselov, K. S., et al., "Electric Field Effect in Atomically Thin Carbon Films," *Science* 306 5696: 666-669 (2004).

Zheng, Y., et al., "Wafer-Scale Graphene/Ferroelectric Hybrid Devices for Low-Voltage Electronics," *EPL* 93(1):17002-p1-4 (2011).

International Preliminary Report on Patentability of International Application No. PCT/SG2013/000429; Date of Issuance: Apr. 7, 2015, Entitled: "Touch Screen Devices Employing Graphene Networks with Polyvinylidene Fluoride Films".

Bae, S., et al., "Roll-to-roll production of 30-inch graphene films for transparent electrodes", *Nature Nanotechnology*, 50: 574-578 (Aug. 2010).

Zheng, Y., et al., "Gate-controlled nonvolatile graphene-ferroelectric memory", *Applied Physics Letters*, 94: 163505-1 to 163505-3 (2009).

* cited by examiner

FIGURE 4

TOUCH SCREEN DEVICES EMPLOYING GRAPHENE NETWORKS WITH POLYVINYLIDENE FLUORIDE FILMS

RELATED APPLICATIONS

This application is the U.S. National Stage of International Application No. PCT/SG2013/000429, filed Oct. 3, 2013, which designates the U.S., published in English, and claims the benefit of U.S. Provisional Application No. 61/709,220, filed on Oct. 3, 2012. The entire teachings of the above applications are incorporated herein by reference.

BACKGROUND OF THE INVENTION

Transparent conductors are a critical component for touch screen displays and solar cells. The key requirements for a transparent conductor are high transparency, high flexibility, high efficiency and low power consumption. Currently, the most commonly used transparent conductor material is indium tin oxide (ITO). However, ITO is expensive and has limited chemical stability. In addition, ITO is fragile and lacks flexibility.

Graphene is a promising candidate for replacing the ITO in touch screens and solar cells. Graphene is highly transparent (~97.3%) over wide wavelengths ranging from visible to near infrared (IR). Owing to its covalent carbon-carbon bonding, graphene is also one of the stiffest materials with a remarkably high Young's modulus of ~1 TPa, yet stretchable and bendable at the same time, with a maximum stretchability of up 20%. However, graphene suffers from high intrinsic sheet resistance (>1 kilo ohms).

Therefore, there remains a need for more cost effective transparent conductors with cheaper fabrication, greater efficiency, and greater flexibility.

SUMMARY OF THE INVENTION

In a first aspect, the present invention relates to a device having a layered structure, comprising a protective layer, a first ferroelectric polymer layer; a first graphene layer, a second ferroelectric polymer layer, a second graphene layer, a third ferroelectric polymer layer; and a substrate layer. The first ferroelectric polymer layer can be located between the protective layer and the first graphene layer. The second ferroelectric polymer layer can be located between the first graphene layer and the second graphene layer and the second graphene layer can be located between the second ferroelectric polymer layer and the third ferroelectric polymer layer. The third ferroelectric polymer layer can be located between the second graphene layer and the substrate layer. In one embodiment, the device is a mutual capacitance touch screen. In another embodiment, the device is a self capacitance touch screen. In yet another embodiment, the device is a resistive touch screen.

In one embodiment, the device can further comprise a fourth ferroelectric polymer layer and a third graphene layer. The third graphene layer can be located between the third ferroelectric polymer layer and the fourth ferroelectric polymer layer, and the fourth ferroelectric polymer layer can be located between the third graphene layer and the substrate layer.

The graphene layer can be single layer graphene or multi-layer graphene. In one embodiment, the graphene layer can be patterned or unpatterned. For example, the first graphene layer and second graphene layer can be patterned to create an interlocking diamond structure, or a grid bar structure. In one embodiment, the first graphene layer and the second graphene layer are patterned. In another embodiment, the first graphene layer and the second graphene layer are patterned and the third graphene layer is unpatterned.

The ferroelectric polymer can be a polymer or copolymer comprising vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, thiourea, or a combination thereof. The ferroelectric polymer can also be a blend of two or more polymers or copolymers.

The ferroelectric polymer layer can be fully polarized, partially polarized, or unpolarized. All the ferroelectric layers can be polarized or some can be polarized while others are partially polarized or unpolarized. In one embodiment, the second ferroelectric polymer layer is polarized. The thickness of the ferroelectric polymer layer can be between about 10 nm and about 100 μm.

In another aspect, the present invention relates to a touch screen, comprising a protective layer, a first ferroelectric polymer layer, a first graphene layer, a second ferroelectric polymer layer, a second graphene layer, a third ferroelectric polymer layer; and a substrate layer. The first ferroelectric polymer layer can be located between the protective layer and the first graphene layer, and the second ferroelectric polymer layer can be located between the first graphene layer and the second graphene layer. The second graphene layer can be located between the second ferroelectric polymer layer and the third ferroelectric polymer layer, and the third ferroelectric polymer layer can be located between the second graphene layer and the substrate layer.

The present invention also relates to a resistive touch screen, comprising a protective layer, a first ferroelectric polymer layer, a first graphene layer, a spacer layer, a second graphene layer, a second ferroelectric polymer layer, a substrate layer. The first ferroelectric polymer layer can be located between the protective layer and the first graphene layer and the spacer layer can be located between the first graphene layer and the second graphene layer. The second graphene layer can be located between the spacer layer and the second ferroelectric polymer layer and the second ferroelectric polymer layer can be located between the second graphene layer and the substrate layer.

In another aspect, the present invention relates to a self-capacitance touch screen, comprising a protective layer, a first ferroelectric polymer layer, a first graphene layer, a second ferroelectric polymer layer, optionally a second graphene layer, optionally a third ferroelectric polymer layer; and a substrate layer. The first ferroelectric polymer layer located between the protective layer and the first graphene layer and the second ferroelectric layer located between the first graphene layer and the second graphene layer. The second graphene layer located between the second ferroelectric layer and the third ferroelectric polymer layer and the third ferroelectric polymer layer is between the second graphene layer and the substrate layer.

The present invention also relates to a method of fabricating a device having a layered structure, comprising: a) depositing a layer of graphene onto a template by template-directed chemical vapor deposition (CVD) to form a first graphene layer, b) optionally patterning the first graphene layer, c) coating the first graphene layer with a ferroelectric polymer layer to form a first graphene-based electrode, d) heating the first graphene-based electrode to a temperature of about 100° C. to about 200° C., e) removing the template via wet chemical etching, f) optionally polarizing the ferroelectric polymer layer of the first graphene-based electrode to form a first graphene-based electrode array, g) depositing a layer of graphene onto a template by template-directed chemical vapor deposition (CVD) to form a second graphene layer, h) optionally patterning the second graphene layer, i) coating the second graphene layer with a ferroelectric polymer layer to form a second graphene-based electrode, i) heating the second graphene-based electrode to a temperature of about 100° C. to about 200° C., j) removing the template via wet chemical etching, k) polarizing the ferroelectric polymer layer of the second graphene-based electrode to form a second graphene-based electrode array, l) and placing the first graphene-based electrode on top of the second graphene-based electrode. The first graphene layer of the first graphene-based electrode is placed such that it faces and is in direct contact with the ferroelectric polymer layer of the second graphene-based electrode.

In one embodiment, the first graphene layer and second graphene layer are patterned to create a grid bar structure and the grid bars of the first graphene layer of the first graphene-based electrode are placed perpendicular to the grid bars of the second graphene layer of the second graphene-based electrode. In another embodiment, the first graphene layer and second graphene layer are patterned to create an interlocking diamond structure and the diamond structure of the first graphene layer of the first graphene-based electrode is placed perpendicular to the diamond structure of the second graphene layer of the second graphene-based electrode.

In one embodiment the method can further comprise placing a first substrate onto the first graphene-based electrode such that the first substrate faces the ferroelectric polymer layer of the first graphene-based electrode; and placing a second substrate onto the second graphene-based electrode such that the second substrate faces the second graphene layer of the second graphene-based electrode.

In another aspect, the method can further comprise a) depositing a layer of graphene onto a template by template-directed chemical vapor deposition (CVD) to form a third graphene layer, b) optionally patterning the third graphene layer, c) coating the third graphene layer with a ferroelectric polymer layer to form a third graphene-based electrode, d) optionally heating the third graphene-based electrode to a temperature of about 100° C. to about 200° C., e) removing the template via wet chemical etching, f) placing the third graphene-based electrode on top of the second graphene-based electrode such that the second graphene layer of the second graphene-based electrode faces the ferroelectric polymer layer of the third graphene-based electrode, g) placing a first substrate onto the first graphene-based electrode such that the first substrate faces the ferroelectric polymer layer of the first graphene-based electrode, and h) placing a second substrate onto the second graphene-based electrode such that the second substrate faces the second graphene layer of the second graphene-based electrode.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

The present invention relates to layered graphene-ferroelectric structures for use as transparent electrodes in touch panels and display screen applications. Although graphene can be used as a transparent electrode to replace ITO, it possesses an intrinsic sheet resistance that is too high to be directly used in touch screens. To overcome this problem and decrease the sheet resistance of graphene, a ferroelectric polymer (e.g., polyvinylidene fluoride-based (PVDF-based) polymer) can be used. The advantages of using ferroelectric polymers include decreasing the sheet resistance of graphene, providing transparency, and yielding non-volatile electric dipoles. Ferroelectric polymers also assist in the binding of the various layers of the layered graphene-ferroelectric polymer structure. In addition, ferroelectric polymers exhibit piezoelectricity allowing generation of voltage upon pressing of the ferroelectric polymer that can be utilized to power mobile devices and/or sense the touch.

The ferroelectric polymer layer can be polarized by applying a perpendicular electric field yielding non-volatile electric dipoles. These dipoles decrease the sheet resistance of graphene in a non-volatile manner allowing graphene to be used in various applications including touch screens and other screen displays. Over a long period of time, various factors may cause the ferroelectric layer to depolarize or the sheet resistance to increase. This problem can be overcome by applying perpendicular electric field to the ferroelectric layer and afterwards the graphene sheet resistance will again decrease.

Figure 1:
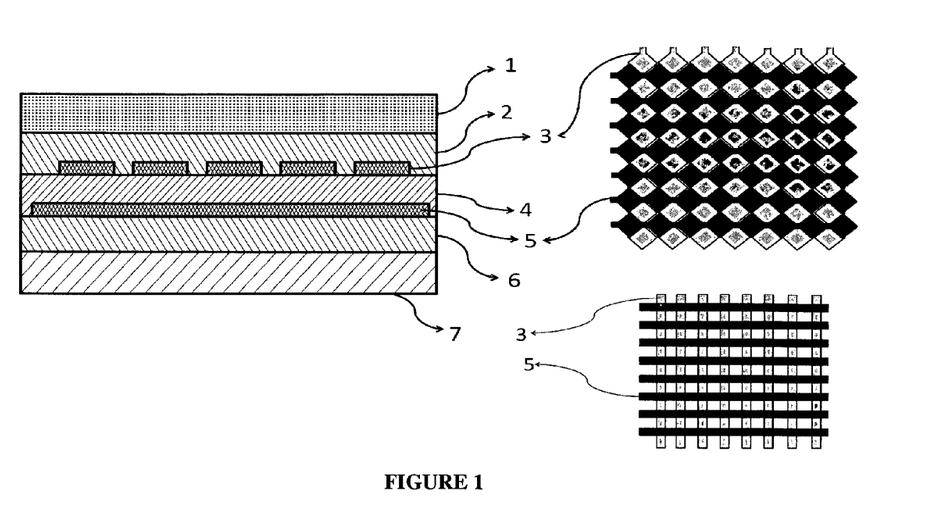
FIG. 1 is a schematic illustration of a mutual capacitance layered graphene-ferroelectric polymer touch screen and a first and second graphene layer patterned in an X-Y interlocking diamond structure.

The most commonly used touch screens are resistive and/or capacitive. Generally, there are two types of capacitive screens: 1) mutual capacitance, and 2) self capacitance type. A layered graphene-ferroelectric polymer structure can be used in both types. FIG. 1 shows a mutual capacitance layered graphene-ferroelectric polymer touch screen. The layered graphene-ferroelectric polymer structure of the mutual capacitance touch screen comprises a protective layer 1, a first ferroelectric polymer layer 2, a first graphene layer 3, a second ferroelectric polymer layer 4, a second graphene layer 5, a third ferroelectric polymer layer 6, and a substrate layer 7. An array of first graphene electrodes or patterned graphene sheets can be placed under the first ferroelectric polymer layer 2. The ferroelectric polymer layer passively decreases the sheet resistance of the graphene. Ferroelectric polymers also have good binding properties and can also be used to bind the various layers of the layered structure. Another ferroelectric polymer layer, the second ferroelectric polymer layer 3, binds, actively dopes the first and second graphene electrodes, and decreases the sheet resistance of the graphene. To activate and polarize the ferroelectric layers a perpendicular electric field should be applied once. But a perpendicular electric field can be reapplied if the sheet resistance increases.

As illustrated in FIG. 1, the first ferroelectric polymer layer 2 is located between the protective layer 1 and the first graphene layer 3. The second ferroelectric polymer layer 4 is located between the first graphene layer 3 and the second graphene layer 5 and the second graphene layer 5 is between the second ferroelectric polymer layer 5 and the third ferroelectric polymer layer 6. The third ferroelectric polymer layer is located between the second graphene layer 5 and the substrate layer 7.

Figure 4:
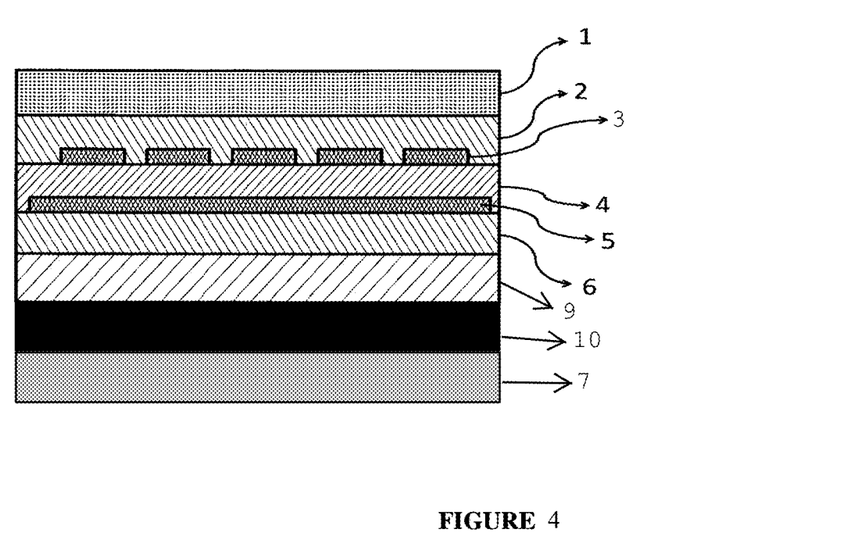
FIG. 4 is a schematic illustration of a mutual capacitance layered graphene-ferroelectric polymer touch screen.

The bottom layer is the substrate layer 7. The second substrate can be, for example, a glass substrate. In addition, as shown in FIG. 4, the mutual capacitance layered structure can further comprise a fourth ferroelectric polymer layer 10 and third graphene layer 9 placed between the third ferroelectric polymer layer 6 and the substrate layer 7. The third graphene layer can be used to apply an electrical field to polarize the ferroelectric layer. This third graphene layer can shield the layered structure from electromagnetic radiation (e.g., from an electronic device beneath the substrate layer). The fourth ferroelectric polymer layer can be used to further dope the second graphene layer as well as bind the second and third graphene layers.

Figure 2:
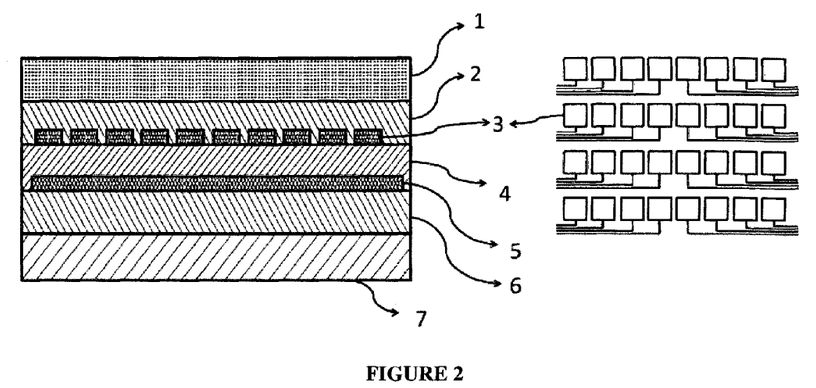
FIG. 2 is a schematic illustration of a self capacitance layered graphene-ferroelectric polymer touch screen and a graphene layer patterned in a repeating rectangle pattern.

FIG. 2 shows a self capacitance layered graphene-ferroelectric polymer touch screen. The self capacitance layered structure is similar to the mutual capacitance structure in that it also has a protective layer 1 followed by a first ferroelectric polymer 2, a first graphene layer 3 (e.g., patterned graphene) a second ferroelectric polymer layer 4, and a substrate layer 7. The first graphene layer can be unpatterned or patterned with various shapes. For example, the first graphene layers can be patterned with a rectangular pattern as shown in FIG. 2. A self capacitance layered structure can optionally comprise a second graphene layer 5 and third ferroelectric polymer layer 6. The first ferroelectric polymer layer binds the protective layer and the first graphene layer 3. The second ferroelectric polymer layer 4 can bind the first graphene layer to the substrate 7 or to the optional second graphene sheet (e.g., an unpatterned graphene sheet). The optional third ferroelectric layer 6 can bind the optional second graphene layer 5 to the substrate layer 7. The optional second graphene layer 5 can be used to polarize the second ferroelectric polymer layer 4 and shield the upper layers from electro-magnetic radiation.

Figure 3:
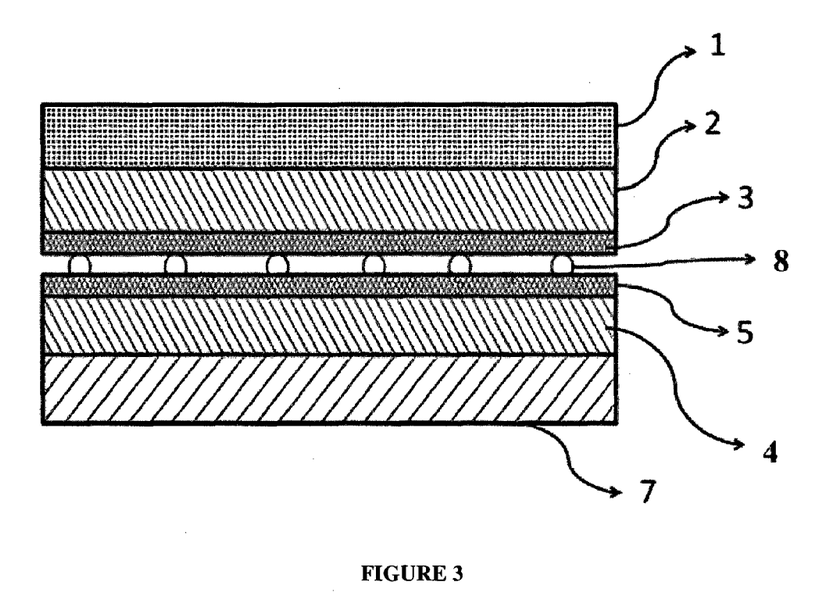
FIG. 3 is a schematic illustration of a resistive layered graphene-ferroelectric polymer touch screen.

FIG. 3 shows a resistive layered graphene-ferroelectric polymer touch screen. A resistive layered touch screen comprises a protective layer 1, a first ferroelectric polymer 2, a first graphene layer 3, a spacer layer 8, a second graphene layer 5, a second ferroelectric polymer layer 4, and a substrate layer 7. In the resistive layered structure, the first ferroelectric polymer layer 2 is between the protective layer 1 and the first graphene layer 3. The spacer layer 8 is between the first graphene layer 3 and the second graphene layer 5, and the second graphene layer 5 is between the spacer layer 8 and the second ferroelectric polymer layer 4. The second ferroelectric polymer layer binds the second graphene layer 5 and the substrate layer 7.

In a mutual capacitance structure, each cross point of the top and bottom electrode array creates a capacitor. Upon touch of a finger the voltage on the capacitor beneath drops, because human finger is electrically changes the electrical field on the capacitor. In self capacitance structure, touch of a human finger serves as a capacitor plate where the bottom capacitor plate is embedded in the touch screen. An alternative read out of a touch can be reading the voltage generated due to pressure applied on the piezoelectric polymer. This voltage either can be used to sense the touch or generate power for the mobile device. The graphene layer closest to the substrate layer 7 can function to polarize the ferroelectric polymer layers above or can be used as an electrode for the display cells of a layered graphene-ferroelectric polymer touch screen.

Graphene is a two dimensional sheet of carbon that has highly desirable physical properties. Graphene is the strongest material known having a Young's modulus of 0.5-1 TPa, yet it is extremely flexible and not brittle. Graphene can be transferred onto any flat or irregular shaped surface and graphene-coated, flexible, supporting substrates can be easily bent into any shape required. While graphene is usually found in its two dimensional form, it is now possible to fabricate the graphene in a three dimensional intercalated network.

"Graphene," as the term is used herein, is defined as single or multiple layers of graphene sheets. [1,2] The graphene as considered in the present invention describes the material, and is not restricted by the methods used to prepare the material. Such methods include, but are not limited to, mechanical exfoliation, epitaxial growth, chemical vapor deposition and chemical processed (solution processed) methods, as well as laser ablation and filtered cathodic arc methods.

The graphene substrates of the present invention include, but are not limited to graphene, graphene foams, activated reduced graphene oxide, functionalized or derivatized graphene, graphene-polymer composites, and graphene flakes, or a combination thereof. A "graphene flake" is defined as a quasi-two-dimensional thin film made of a number of graphene layers (e.g., ranging from one layer to a thousand layers). Such flakes can be composed of either a single layer or multi-layers of graphene. Graphene of the invention includes, but is not limited to, chemical vapor deposited graphene, epitaxial grown graphene, mechanical exfoliated graphene, and chemically modified graphene, or a combination thereof. As used herein, "functionalized or derivatized graphene" refers to the chemical attachment of chemical functional groups or dye molecules on the graphene or graphene oxide for the purpose of modifying its solubility, dispersability, electronic and optical properties.

Graphene of the invention includes, but is not limited to, chemical vapor deposited graphene, epitaxial grown graphene, mechanical exfoliated graphene, and chemically modified graphene, or a combination thereof. As used herein, "functionalized or derivatized graphene" refers to the chemical attachment of chemical functional groups or dye molecules on the graphene or graphene oxide for the purpose of modifying its solubility, dispersability, electronic and optical properties.

The graphene can be single or multiple layers graphene. The term "multi-layer graphene" refers to graphene that has multiple layers of single atomic layer graphene. In one embodiment, graphene is multi-layer graphene. The graphene can have between about 1 to about 20 layers. Preferably the graphene has between about 1 to about 15 layers, more preferably between about 2 to about 10 layers, most preferably between about 2 to about 5 layers.

As used herein, the term "single layer graphene" refers to a graphene monoatomic sheet that has less than or about 5% two or three layer graphene. In another embodiment of the invention, the graphene is single layer graphene. In one non-limiting embodiment, the graphene has about 5% two and three layer graphene. In another embodiment, graphene has less than 5% two and three layer graphene.

In one embodiment, the graphene is made by growing graphene on a metal surface (e.g., nickel, copper) using chemical vapor deposition. Chemical vapor deposition (CVD) refers to a chemical process used to produce high-purity, high-performance solid materials where a template is exposed to one or more volatile precursors, which react and/or decompose on the template surface to produce the desired deposit. Graphene can be directly deposited using CVD onto any template suitable for preparation of graphene. Templates are not limited to planar substrates but can be three dimensional forms of nickel, copper or any other material facilitating the growth of graphene. For example, the template can be a foam-like shape (e.g., nickel foam). All of the templates can be subsequently removed by chemical wet etching. [3]

Multi-layer graphene can be directly grown as multi-layers by means of chemical vapor deposition. Alternatively, the graphene can be grown as single layers via CVD and then stacked on top of each other to form a single substrate. For example, a single layer of graphene can be grown on a metal template. A polymer (e.g., a ferroelectric polymer) can then be layered on the graphene so that the metal template can be removed by chemical etching. The layers of graphene can then be transferred onto the single layer graphene on the polymer to form the multi-layer graphene.

Templates that may be used for growing graphene include, but are not limited to, nickel, copper, scandium, titanium, vanadium, manganese, iron, cobalt, ruthenium, platinum, silicon carbide (SiC), and may include also non-metal or non-oxide substrates.

The graphene layer (e.g., first graphene layer, second graphene layer, third graphene layer, etc.) can be unpatterned or patterned. As used herein, "patterning" means to cut and remove the unwanted regions of a whole graphene sheet to create well-defined graphene structures. Patterning can be used to make numerous arrangements and patterns in the graphene structures. Non-limiting examples include one or more of the following patterns: crossbars, bars, stripes, circles random diamonds, rectangles, spheroid, parallelogram, or hatched. If the graphene substrate is patterned, a laser or electron beam can be used to pattern the graphene substrate while it is still attached to the metal template. The graphene substrate can also be annealed by using a laser or by simply heating the graphene under an atmosphere hydrogen-argon ($H_2$—Ar) gas mixture. Annealing of the graphene can used to enhance the quality of the graphene substrate. The same laser can be used to both pattern and anneal the graphene substrate. The laser power required for the annealing process is lower than that used for the patterning process. For example, the graphene layers can be patterned in an interlocking diamond shape structure as illustrated in FIG. 1. Alternatively, the graphene layers can be patterned in a grid bar structure (FIG. 1). The patterns can be parallel or orthogonal to each other.

The patterns of each graphene layer can be parallel or orthogonal to each other. For example, the first graphene layer and the second graphene layer can each be patterned to form bars or lines in the graphene layer. The bars or lines of the first graphene layer can be placed perpendicular to bars or lines of the second graphene layer to form a grid bar structure. Alternatively, the first graphene layer and the second graphene layer can each be patterned with a diamond shape. The diamonds shapes of the first graphene layer can be placed perpendicular (e.g., in the X-direction) to the diamond shapes of the second graphene layer (e.g., in the Y-direction) to form and X-Y diamond grid.

A ferroelectric polymer layer (e.g., poly(vinylidene fluoride-co-trifluoroethylene)) can then be deposited or coated onto the graphene substrate prior to removal of the metal template. The deposition of the layer of the ferroelectric polymer can be performed using various methods. Examples of methods that can be used to deposit the ferroelectric polymer layer on the graphene include, but are not limited to, spin coating method, bar-coating method and hot press deposition.

The ferroelectric polymer layer can be used to remove the graphene substrate from the metal template. The metal template is removed via mechanical peeling or chemical etching to provide the graphene-ferroelectric layered structure. Chemical etching as defined herein is a process of using acids, bases or other chemicals to dissolve a metal template. For example, a copper template can be removed after chemical vapor deposition of graphene using hot hydrochloric acid (HCl), HCl/iron chloride ($FeCl_3$) or ammonium persulfate solution, or a combination thereof, to provide the graphene-ferroelectric hybrid material.

Post annealing of the ferroelectric polymer can enhance the quality of the polymer. Post annealing of the ferroelectric polymer layer can be accomplished by heating the graphene substrate-ferroelectric polymer structure to about 100° C. to about 200° C. for 2 to 25 hours, preferably about 100° C. to about 150° C. The quality of the ferroelectric polymer can also be enhanced by stretching (e.g., stretching between about 1% to about 10%) or applying an electric field.

As used herein, a "ferroelectric polymer" refers to polymers that maintain a permanent electric polarization that can be reversed, or switched in the presence of an external electric field. The ferroelectric polymer can be a polymer or a copolymer. As used herein, the term "polymer" refers to a macromolecule made of repeating monomer units. The term "copolymer" is defined as a polymer of at least two chemically distinct monomers. The copolymers of the invention include, but are not limited to, alternating copolymers, statistical copolymers, block copolymers, random copolymer, and graft copolymers. In one embodiment, the polymer used to form the ferroelectric polymer is a polymer comprising at least one monomer. In another embodiment, the polymer used to form the ferroelectric polymer is a copolymer comprising one or more monomers.

In one embodiment, the ferroelectric polymer is a polymer or copolymer. The monomers that can be used to synthesize the ferroelectric polymers or copolymers of the present invention include, but are not limited to, vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, and thiourea, or a combination thereof. The ferroelectric polymers of the present invention can be a copolymer comprising two or more monomers. The ratio of one monomer to another monomer or monomers used to synthesize the copolymers can vary depending on the properties desired. The ratio of one monomer to another monomer can be between about 65:35 to about 90:10. For example, the copolymer poly(vinylidene fluoride-co-trifluoroethylene) (P(VDF-TrFE)) can contain a ratio of about 65:35 of vinylidene fluoride:trifluoroethylene. In one embodiment, the ferroelectric polymer is polyvinylidene fluoride. In another embodiment, the ferroelectric polymer is (P(VDF-TrFE)). The ferroelectric polymer can also be a blend of two or more polymers or copolymers, For example, the ferroelectric polymer can be a blend of P(VDF-TrFE) and poly(methyl methacrylate) (PMMA).

The thickness of the ferroelectric polymer layer can be between about 100 micrometer (1 μm) and about 10 nanometers (10 nm). Preferably, the ferroelectric polymer layer is between 10 nm and 10 μm, more preferable between 100 nm and 5 μm. The thickness of each ferroelectric polymer layer can be the same or different. For example, the first ferroelectric polymer layer can be 10 μm and the second ferroelectric polymer layer can be 900 nm. In one embodiment, the ferroelectric polymer layer is a ferroelectric polymer film.

The ferroelectric polymer layer can be polarized by applying a perpendicular electric field yielding non-volatile electric dipoles. One ferroelectric polymer layer or multiple ferroelectric polymer layers can be polarized. For example, the second ferroelectric polymer layer can be polarized and the first and third ferroelectric polymer layers can be polarized. The presence of ferroelectric polymer layers can prevent the sheet resistance of the graphene layers from increasing back to the original value. Preferably, the sheet resistance increases to less than about 30% of the original value over about 1 to about 200 hours, more preferably to less than about 20%, most preferably to less than 10%.

By tuning the permanent dipole orientation of the ferroelectric polymer layer through an external electric field, the graphene can be heavily electrostatically doped by the well aligned dipoles, thus providing a low sheet resistance value. Beyond low sheet resistance, the heavily doped graphene layer can be either p-type or n-type, depending on the polarity of POL. Such simple and elegant work function tunability of graphene is highly desirable for solar cell and touch screen displays applications, where the efficiency of these multilayer stacked devices is largely determined via the reducing the potential barriers through proper band alignment. The ferroelectric polymer layer can be polarized multiple times if at any time the polymer is depolarized or if graphene sheet resistance increased (e.g., above 100 ohms).

The spacer layer can generally comprise any insulating or dielectric material (e.g., polymeric resin) and may take various forms (e.g., microsphere, sphere, sheet, etc.). The spacer layer can comprise dot shaped spheres located at regular distances, (e.g., every few millimeters). For example, the spacer layer can comprise spheres about 10 μm in height and between about 10 μm to about 50 μm in diameter. Suitable insulating or dielectric materials that may be employed to prepare the spacer layer include, but are not limited to, light or thermal hardened epoxy, acrylated-urethanes, acrylic, or a combination thereof, as well as other polymeric resin compositions well known by one of ordinary skill in the art. Alternatively, the spacers can comprise nanoparticles including, but not limited to, silica, alumina, zinc oxide or a combination thereof.

The substrate layer and the protective layer can be rigid or flexible and coated with additional layers such as hardcoat (e.g., clear and/or antiglare), anti-reflective coating and/or anti-newton ring coating. For example, the substrate layer and protective layer can be glass, quartz, boron nitride, silicon, plastics, polyethylene terephthalate (PET), polyethylene naphthalate (PEN), polycarbonate (PC), polyethersulfone (PES), or a combination thereof. The substrate layer and the protective layer can be transparent.

As used herein, a layer or multiple layers of different materials is said to be transparent when the layer or layers permit at least 50% of the ambient electromagnetic radiation in relevant wavelengths to be transmitted through the layer or layers. The individual layers of the layered graphene-ferroelectric polymer structure or layered graphene-ferroelectric polymer structure can be transparent. The individual layers or the layered graphene-ferroelectric polymer structure can have a transparency greater than about 80%, preferably greater than about 90% and more preferably greater than about 95%.

The layered graphene-ferroelectric polymer structure provides a lower sheet resistance. For example, the layered graphene-ferroelectric polymer structure can have a sheet resistance below about 300 ohms/square (Ω/sq), preferably below about 200 Ω/sq, and more preferably below about 100 Ω/sq. The layered graphene-ferroelectric structure can also comprise a feedback circuit that senses an increase in sheet resistance (e.g., an increase of 10%) and triggers an application of an electric field to the ferroelectric layers located between two graphene layers. The application of the electric field decreases the sheet resistance to the original value prior to the sensed increase with a deviation of less than about 5%, preferably less than about 3%.

The layered graphene-ferroelectric polymer structure may also have excellent flexibility, foldability and stretchability. For pure graphene, the original resistance state can be recovered even after 20% tensile strain or 6% stretching force are applied. This is desirable for the photovoltaic applications, such as displays, solar cell etc. If the protective layer and the substrate layer of the layered structure are both flexible, then whole touch screen can be flexible. Alternative graphene growth and deposition techniques can be adapted to this process easily by starting from the patterning process or annealing process.

In another aspect, the present invention relates to a method of fabricating a device having a layered structure, comprising: a) depositing a layer of graphene onto a template by template-directed chemical vapor deposition (CVD) to form a first graphene layer; b) optionally patterning the first graphene layer; coating the first graphene layer with a ferroelectric polymer layer to form a first graphene-based electrode; c) heating the first graphene-based electrode to a temperature of about 100° C. to about 200° C., preferably about 120° C. to about 150° C.; d) removing the template via wet chemical etching; e) optionally polarizing the ferroelectric polymer layer of the first graphene-based electrode to form a first graphene-based electrode array; f) depositing a layer of graphene onto a template by template-directed chemical vapor deposition (CVD) to form a second graphene layer; g) optionally patterning the second graphene layer; h) coating the second graphene layer with a ferroelectric polymer layer to form a second graphene-based electrode; i) heating the second graphene-based electrode to a temperature of about 100° C. to about 200° C., preferably about 120° C. to about 150° C.; j) removing the template via wet chemical etching; k) polarizing the ferroelectric polymer layer of the second graphene-based electrode to form a second graphene-based electrode array; and k) placing the first graphene-based electrode on top of the second graphene-based electrode such that the first graphene layer of the first graphene-based electrode faces and is in direct contact with the ferroelectric polymer layer of the second graphene-based electrode. The first graphene-based electrode array is perpendicular to the second graphene-based electrode array.

In one embodiment, the method can further comprise placing a first substrate onto the first graphene-based electrode such that the first substrate faces the ferroelectric polymer layer of the first graphene-based electrode; and placing a second substrate onto the second graphene-based electrode such that the second substrate faces the second graphene layer of the second graphene-based electrode. The first ferroelectric layer is located between the protective layer and the first graphene layer and the third ferroelectric layer is located between the second graphene layer and the substrate layer.

In another embodiment, the method of can further comprise a) depositing a layer of graphene onto a template by template-directed chemical vapor deposition (CVD) to form a third graphene layer; b) optionally patterning the third graphene layer; c) coating the third graphene layer with a ferroelectric polymer layer to form a third graphene-based electrode; d) optionally heating the third graphene-based electrode to a temperature of about 100° C. to about 200° C., preferably about 120° C. to about 150° C.; e) removing the template via wet chemical etching; f) placing the third graphene-based electrode on top of the second graphene-based electrode such that the second graphene layer of the second graphene-based electrode faces the ferroelectric polymer layer of the third graphene-based electrode; g) placing a first substrate onto the first graphene-based electrode such that the first substrate faces the ferroelectric polymer layer of the first graphene-based electrode; and h) placing a second substrate onto the second graphene-based electrode such that the second substrate faces the second graphene layer of the second graphene-based electrode. The ferroelectric layers can be polarized when coated onto the graphene substrate or once the layered graphene-ferroelectric polymer structure is assembled.

The various layers of the graphene-ferroelectric polymer layered structure can be placed on top of each other. In the mutual capacitance layered, the first graphene-based electrode is placed on top of the second graphene-based electrode. The first and second graphene-based electrode can be placed on top of a third graphene-based electrode. The layered graphene-ferroelectric polymer structure is not limited to three graphene based electrodes and can include additional graphene-based electrode layers that further decrease graphene sheet resistance. The various graphene-based electrode can be placed such that the pattern in each graphene substrate is in the same direction (e.g., in the X-direction) or orthogonal to each other (e.g., in the X- and Y-direction). For example, the pattern in first graphene substrate of the first graphene-based electrode can be placed in the X-direction and the pattern in the second graphene substrate of the second graphene-based electrode pattern can be placed in the Y-direction. The touch by a touching object (e.g., a finger) on a layered graphene-ferroelectric polymer touch screen can be sensed by the crosspoints (e.g., points where the patterns meet) formed from placement of the first graphene-based electrode perpendicular to the second graphene-based electrode or mapped to the sensing crosspoint locations on the touch screen.

REFERENCES

1. K. S. Novoselov, D. Jiang, F. Schedin, T. J. Booth, V. V. Khotkevich, S. V. Morozov, A. K. Geim, *PNAS,* 102, 30, 10451 (2005).
2. K. S. Novoselov, A. K. Geim, S. V. Morozov, D. Jiang, Y. Zhang, S. V. Dubonos, L. V. Grigorieva, A. A. Firsov, *Science,* 306, 5696, 666, (2004).
3. H. X. Ji, L. L. Zhang, M. T. Pettes, H. F. Li, S. S. Chen, L. Shi, R. Piner, R. S. Ruoff, *Nano Lett,* 12, 5, 2446 (2012).

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A device having a layered structure, comprising:
    a) a protective layer;
    b) a first ferroelectric polymer layer;
    c) a first graphene layer;
    d) a second ferroelectric polymer layer;
    e) a second graphene layer;
    f) a third ferroelectric polymer layer; and
    g) a substrate layer;
        wherein the first ferroelectric polymer layer is between the protective layer and the first graphene layer,
        wherein the second ferroelectric polymer layer is between the first graphene layer and the second graphene layer,
        wherein the second graphene layer is between the second ferroelectric polymer layer and the third ferroelectric polymer layer, and
        wherein the third ferroelectric polymer layer is between the second graphene layer and the substrate layer.

2. The device of claim 1, wherein the device further comprises:
    a) a fourth ferroelectric polymer layer; and
    b) a third graphene layer,
        wherein the third graphene layer is between the third ferroelectric polymer layer and the fourth ferroelectric polymer layer, and
        wherein the fourth ferroelectric polymer layer is between the third graphene layer and the substrate layer.

3. The device of claim 1, wherein the first graphene layer is single layer graphene or multi-layer graphene and the second graphene layer is single layer graphene or multi-layer graphene.

4. The device of claim 3, wherein the multi-layer graphene is made by chemical vapor deposition.

5. The device of claim 4, wherein the sheet resistance of the layered structure is maintained below about 300 ohms per square.

6. The device of claim 1, wherein:
    the first ferroelectric polymer layer is fully polarized, partially polarized, or unpolarized;
    the second ferroelectric polymer layer is fully polarized, partially polarized, or unpolarized; and
    the third ferroelectric polymer layer is fully polarized, partially polarized, or unpolarized.

7. The device of claim 1, wherein the second ferroelectric polymer layer is polarized.

8. The device of claim 1, wherein:
    the first ferroelectric polymer is a polymer or copolymer comprising vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, thiourea, or a combination thereof, or a blend of two or more polymers or copolymers comprising vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, thiourea, or a combination thereof;
    the second ferroelectric polymer is a polymer or copolymer comprising vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, thiourea, or a combination thereof, or a blend of two or more polymers or copolymers comprising vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, thiourea, or a combination thereof; and the third ferroelectric polymer is a polymer or copolymer comprising vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, thiourea, or a combination thereof, or a blend of two or more polymers or copolymers comprising vinylidene fluoride, trifluoroethylene, chlorotrifluoroethylene, tetrafluoroethylene, hexafluoropropylene, 1,1-chlorofluoroethylene, poly(methyl methacrylate), 11-aminoundecanoic acid, thiourea, or a combination thereof.

9. The device of claim 1, wherein:
the first ferroelectric polymer is a ferroelectric polymer thin film having a thickness between about 10 nm and about 100 μm;
the second ferroelectric polymer is a ferroelectric polymer thin film having a thickness between about 10 nm and about 100 μm, and
the third ferroelectric polymer is a ferroelectric polymer thin film having a thickness between about 10 nm and about 100 μm.

10. The device of claim 1, wherein the first graphene layer and second graphene layer are patterned to create an interlocking diamond structure, or a grid bar structure.

11. The device structure of claim 1, wherein the first graphene layer and second graphene layer are patterned into a repeating rectangle pattern.

12. The device of claim 1, wherein the device has a transparency greater than about 80%.

13. The device of claim 1, wherein the device further comprises a feedback circuit that senses increases in sheet resistance and triggers the application of an electric field to the second ferroelectric polymer layer.

14. A touch screen, comprising:
a) a protective layer;
b) a first ferroelectric polymer layer;
c) a first graphene layer;
d) a second ferroelectric polymer layer;
e) a second graphene layer;
f) a third ferroelectric polymer layer; and
g) a substrate layer;
wherein the first ferroelectric polymer layer is between the protective layer and the first graphene layer,
wherein the second ferroelectric polymer layer is between the first graphene layer and the second graphene layer,
wherein the second graphene layer is between the second ferroelectric polymer layer and the third ferroelectric polymer layer, and
wherein the third ferroelectric polymer layer is between the second graphene layer and the substrate layer.

15. A resistive touch screen, comprising:
a) a protective layer;
b) a first ferroelectric polymer layer;
c) a first graphene layer;
d) a spacer layer;
e) a second graphene layer;
f) a second ferroelectric polymer layer; and
g) a substrate layer;
wherein the first ferroelectric polymer layer is between the protective layer and the first graphene layer,
wherein the spacer layer is between the first graphene layer and the second graphene layer,
wherein the second graphene layer is between the spacer layer and the second ferroelectric polymer layer, and
wherein the second ferroelectric polymer layer is between the second graphene layer and the substrate layer.

16. A self-capacitance touch screen, comprising:
a) a protective layer;
b) a first ferroelectric polymer layer;
c) a first graphene layer;
d) a second ferroelectric polymer layer; and
e) a substrate layer;
wherein the first ferroelectric polymer layer is between the protective layer and the first graphene layer,
wherein the second ferroelectric layer is between the first graphene layer and the substrate layer.

17. A touch screen, comprising:
a) a protective layer;
b) a first ferroelectric polymer layer;
c) a first graphene layer;
d) a second graphene layer;
e) a second ferroelectric polymer layer; and
f) a substrate layer;
wherein the first ferroelectric polymer layer is between the protective layer and the first graphene layer,
wherein the second graphene layer is between the first graphene layer and the second ferroelectric polymer layer, and
wherein the second ferroelectric polymer layer is between the second graphene layer and the substrate layer.

* * * * *